US 10,991,291 B2

(12) United States Patent
Hao et al.

(10) Patent No.: US 10,991,291 B2
(45) Date of Patent: Apr. 27, 2021

(54) TEST DEVICE AND TEST METHOD

(71) Applicant: BOE TECHNOLOGY GROUP CO., LTD., Beijing (CN)

(72) Inventors: Xueguang Hao, Beijing (CN); Yong Qiao, Beijing (CN); Xinyin Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 170 days.

(21) Appl. No.: 16/338,617

(22) PCT Filed: Nov. 2, 2018

(86) PCT No.: PCT/CN2018/113748
§ 371 (c)(1),
(2) Date: Apr. 1, 2019

(87) PCT Pub. No.: WO2019/184351
PCT Pub. Date: Oct. 3, 2019

(65) Prior Publication Data
US 2020/0394947 A1 Dec. 17, 2020

(30) Foreign Application Priority Data
Mar. 27, 2018 (CN) .......................... 201820419392.9

(51) Int. Cl.
G09G 3/20 (2006.01)
G01R 31/26 (2020.01)

(52) U.S. Cl.
CPC ....... *G09G 3/2003* (2013.01); *G01R 31/2635* (2013.01); *G09G 2330/12* (2013.01)

(58) Field of Classification Search
None
See application file for complete search history.

(56) References Cited

U.S. PATENT DOCUMENTS 9,147,619 B2 9/2015 Lee
9,990,873 B2 6/2018 Jang et al.
(Continued)

FOREIGN PATENT DOCUMENTS

CN 102944945 A 2/2013
CN 105676497 A 6/2016
(Continued)

OTHER PUBLICATIONS

International Search Report and Written Opinion for International Appl. No. PCT/CN2018/113748, dated Jan. 31, 2019.

*Primary Examiner* — Christopher J Kohlman
(74) *Attorney, Agent, or Firm* — The Webb Law Firm

(57) ABSTRACT

The present disclosure provides a test device and a test method. The test device includes a first circuit, a second circuit and a third circuit. The first circuit drives a first pixel to emit light by using a first set of test signals according to the control of a first switch signal and a second switch signal, the second circuit drives a second pixel to emit light by using the first set of test signals according to the control of the first switch signal and the second switch signal, and the third circuit drives a third pixel to emit light by using a second set of test signals according to the control of the first switch signal or the second switch signal, wherein the first pixel, the second pixel and the third pixel are mutually different.

18 Claims, 10 Drawing Sheets

(56) References Cited

U.S. PATENT DOCUMENTS

| | | | | |
|---|---|---|---|---|
| 2009/0267496 | A1* | 10/2009 | Jeong | G09G 3/006 313/504 |
| 2010/0225770 | A1* | 9/2010 | Morimoto | G09G 3/006 348/189 |
| 2014/0354286 | A1* | 12/2014 | Kim | G09G 3/006 324/414 |
| 2018/0336809 | A1* | 11/2018 | Xi | G09G 3/20 |
| 2019/0311662 | A1* | 10/2019 | Kim | G09G 3/2003 |

FOREIGN PATENT DOCUMENTS

| | | |
|---|---|---|
| CN | 106531039 A | 3/2017 |
| CN | 106935167 A | 7/2017 |
| CN | 207925107 U | 9/2018 |
| KR | 20090090677 A | 8/2009 |
| KR | 20150039491 A | 4/2015 |
| KR | 20150101066 A | 9/2015 |

\* cited by examiner

TEST DEVICE AND TEST METHOD

CROSS-REFERENCE TO RELATED APPLICATIONS

The present application is a U.S. National Stage Application under 35 U.S.C. § 371 of International Patent Application No. PCT/CN2018/113748, filed on Nov. 2, 2018, which claims priority to CN Application No. 201820419392.9, filed on Mar. 27, 2018, the disclosed contents of each of which are hereby incorporated in the present application in entirety.

TECHNICAL FIELD

The present disclosure relates to the field of testing, and in particular to a test device and a test method.

BACKGROUND

A display panel needs to be electrically tested before being bound to a chip and a flexible circuit. Display pictures of different colors are tested to check whether there are defects such as bright spots, dark spots, and bright lines on the display pictures. Therefore, the subsequent module manufacturing process for a defective product can be avoided, which avoids a waste of material for the module and is capable of stopping loss timely.

SUMMARY

According to a first aspect of the embodiments of the present disclosure, a test device is provided. The test device comprises: a first circuit electrically connected with a first switching signal line, a second switching signal line and a first set of test signal lines and configured to drive a first pixel to emit light by using a first set of test signals according to a control of a first switch signal and a second switch signal; a second circuit electrically connected with the first switching signal line, the second switching signal line and the first set of test signal lines and configured to drive a second pixel to emit light by using the first set of test signals according to the control of the first switch signal and the second switch signal; a third circuit electrically connected with the first switching signal line or the second switching signal line, and electrically connected with a second set of test signal lines, and configured to drive a third pixel to emit light by using a second set of test signals according to the control of the first switch signal or the second switch signal, wherein the first pixel, the second pixel and the third pixel are mutually different.

In some embodiments, the first set of test signal lines include a first test signal line and a second test signal line.

In some embodiments, the first circuit includes: a first switch electrically connected to the first switching signal line and the first test signal line and configured to drive the first pixel to emit light by using a first test signal under the control of the first switch signal; a second switch electrically connected with the second switching signal line and the second test signal line and configured to drive the first pixel to emit light by using a second test signal under the control of the second switch signal.

In some embodiments, the first switch and the second switch are switching transistors.

In some embodiments, a gate of the first switch is electrically connected to the first switching signal line, a drain of the first switch is electrically connected to the first test signal line, and a source of the first switch is electrically connected to the first pixel; a gate of the second switch is electrically connected to the second switching signal line, a drain of the second switch is electrically connected to the second test signal line, and a source of the second switch is electrically connected to the first pixel.

In some embodiments, the second circuit includes: a third switch electrically connected with the first switching signal line and the second test signal line and configured to drive the second pixel to emit light by using the second test signal under the control of the first switch signal; a fourth switch electrically connected with the second switching signal line and the first test signal line and configured to drive the second pixel to emit light by using the first test signal under the control of the second switch signal.

In some embodiments, the third switch and the fourth switch are switching transistors.

In some embodiments, a gate of the third switch is electrically connected to the first switching signal line, a source of the third switch is electrically connected to the second test signal line, and a drain of the third switch is electrically connected to the second pixel; a gate of the fourth switch is electrically connected to the second switching signal line, a source of the fourth switch is electrically connected to the first test signal line, and a drain of the fourth switch is electrically connected to the second pixel.

In some embodiments, the third pixel include a first sub-pixel and a second sub-pixel.

In some embodiments, the third circuit includes: a fifth switch electrically connected with the first switching signal line and the second set of test signal lines and configured to drive the first sub-pixel to emit light by using the second set of test signals under the control of the first switch signal; a sixth switch electrically connected with the first switching signal line and the second set of test signal lines and configured to drive the second sub-pixel to emit light by using the second set of test signals under the control of the first switch signal.

In some embodiments, the fifth switch and the sixth switch are switching transistors.

In some embodiments, a gate of the fifth switch is electrically connected to the first switching signal line, a source of the fifth switch is electrically connected to the second set of test signal lines, and a drain of the fifth switch is electrically connected to the first sub-pixel; a gate of the sixth switch is electrically connected with the gate of the fifth switch, a source of the sixth switch is electrically connected with the second set of test signal lines, and the drain of the sixth switch is electrically connected with the second sub-pixel.

In some embodiments, the third circuit includes: a fifth switch electrically connected with the second switching signal line and the second set of test signal lines and configured to drive the first sub-pixel to emit light by using the second set of test signals under the control of the second switch signal; a sixth switch electrically connected with the second switching signal line and the second set of test signal lines and configured to drive the second sub-pixel to emit light by using the second set of test signals under the control of the second switch signal.

In some embodiments, the fifth switch and the sixth switch are switching transistors.

In some embodiments, a gate of the fifth switch is electrically connected to the second switching signal line, a source of the fifth switch is electrically connected to the second set of test signal lines, and a drain of the fifth switch is electrically connected to the first sub-pixel; a gate of the sixth switch is electrically connected with the gate of the fifth switch, a source of the sixth switch is electrically connected with the second set of test signal lines, and a drain of the sixth switch is electrically connected with the second sub-pixel.

In some embodiments, the second set of test signal lines include a third test signal line.

In some embodiments, the first pixel is blue pixel; the second pixel is red pixel; the third pixel is green pixel.

According to a second aspect of the embodiments of the present disclosure, a method of testing pixels is provided. The method comprising: controlling level states of a first switching signal line and a second switching signal line so as to control conductive states of a first circuit, a second circuit and a third circuit; controlling level states of a first set of test signal lines and a second set of test signal lines, so that the first circuit drives a first pixel to emit light by using the first set of test signals while in a conductive state, the second circuit drives a second pixel to emit light by using the first set of test signals while in the conductive state, and the third circuit drives a third pixel to emit light by using the second set of test signals while in the conductive state; wherein, the first circuit is electrically connected with the first switching signal line, the second switching signal line and the first set of test signal lines, and is configured to drive the first pixel to emit light by using the first set of test signals according to the control of a first switch signal and a second switch signal; the second circuit is electrically connected with the first switching signal line, the second switching signal line and the first set of test signal lines, and is configured to drive the second pixel to emit light by using the first set of test signals according to the control of the first switch signal and the second switch signal; the third circuit is electrically connected with the first switching signal line or the second switching signal line, and is electrically connected with the second set of test signal lines, and is configured to drive the third pixel to emit light by using the second set of test signals according to the control of the first switch signal or the second switch signal, wherein the first pixel, the second pixel and the third pixel are mutually different.

Further features of the present disclosure, as well as advantages thereof, will become clearer from the following detailed description of exemplary embodiments of the present disclosure with reference to the accompanying drawings.

BRIEF DESCRIPTION OF THE DRAWINGS

The accompanying drawings, which constitute a part of the specification, illustrate embodiments of the present disclosure and, together with the description, serve to explain the principles of the present disclosure.

The present disclosure may be understood more clearly from the following detailed description with reference to the accompanying drawings, wherein.

Figure 1:
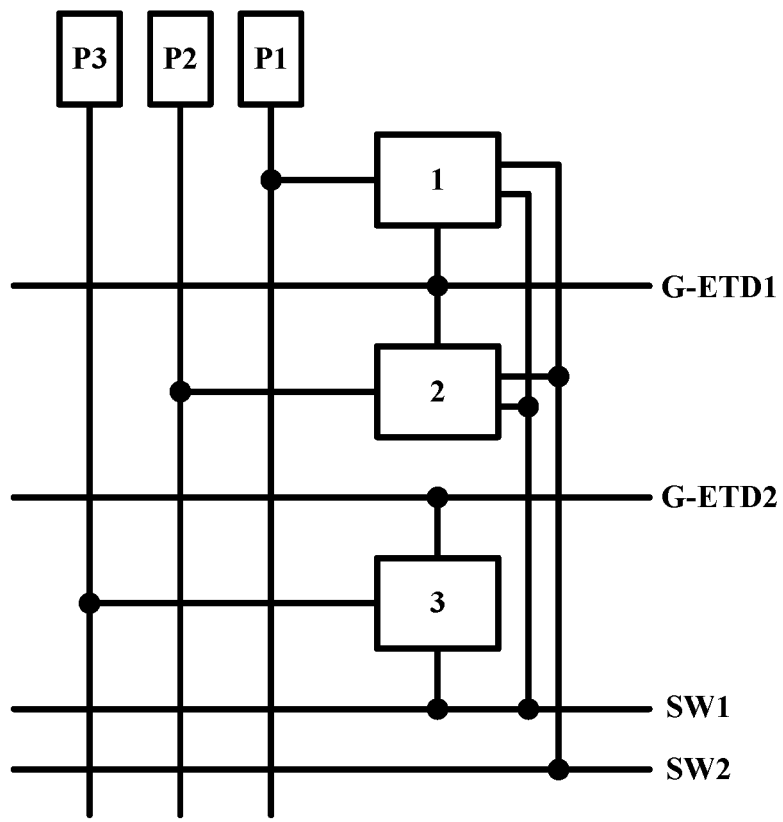
FIG. 1 is a structural diagram of a test device according to one embodiment of the present disclosure.

It should be understood that the dimensions of the various parts shown in the drawings are not drawn according to the actual proportional relationship. In addition, the same or similar reference signs denote the same or similar components.

DETAILED DESCRIPTION

The exemplary embodiments of the present disclosure will be described in detail with reference to the accompanying drawings. The description of the exemplary embodiments is intended to be merely illustrative, and is not meant to be limitation on the present disclosure and its application or use in any way. The present disclosure may be implemented in many different forms, not limited to the embodiments described herein. These embodiments are provided so that this disclosure will be thorough and complete, and will fully convey the scope of the disclosure to those skilled in the art. It should be noted that, unless otherwise specified, relative arrangement of components and steps, ingredients of the materials, numerical expressions and numerical values set forth in these embodiments are to be construed as merely illustrative, not as a limitation.

The terms "first", "second" and similar words used in the present disclosure do not denote any order, quantity, or importance, but merely serve to distinguish different parts. Similar words like "include" or "comprise" mean that the element that precedes the word covers the elements listed after that term, but does not exclude the possibility of also covering other elements. "Up", "Down", "Left", "Right", and the like are used only to indicate a relative positional relationship, and when the absolute position of the described object is changed, the relative positional relationship may also change correspondingly.

In the present disclosure, when it is described that a specific component is located between a first component and a second component, an intervening component may exist between the specific component and the first or second component, or there may be no intervening component. When it is described that a specific component is connected to other components, the specific component may be directly connected with the other components without having an intervening component therebetween, or may not be directly connected with the other components but have an intervening component therebetween.

Unless otherwise specifically defined, all terms (including technical terms or scientific terms) used in the present disclosure have the same meanings as understood by an ordinary person skilled in the art to which the present disclosure belong. It will also be understood that terms defined in, for example, common dictionaries should be interpreted as having meanings that are consistent with their meanings in the context of the relevant art, and should not be interpreted in an idealized or extremely formal sense unless expressly defined here.

Techniques, methods, and devices known to an ordinary person skilled in the relevant art may not be discussed in detail but, where appropriate, such techniques, methods, and devices are to be considered part of the description.

The inventor has noticed that the test circuit in the related art is relatively complicated, and more switching signal lines are used, resulting in a larger frame occupied by the test circuit.

For this reason, the embodiments of the present disclosure provide a solution for reducing the number of switching signal lines to reduce the space occupied by the test circuit.

FIG. 1 is a structural diagram of a test device according to one embodiment of the present disclosure.

As shown in FIG. 1, a test circuit includes a first circuit 1, a second circuit 2, a third circuit 3, a first switching signal line SW1, a second switching signal line SW2, a first set of signal lines G-ETD1 and a second set of test signal lines G-ETD2.

The first circuit 1 is electrically connected with the first switching signal line SW1, the second switching signal line SW2 and the first set of test signal lines G-ETD1 and configured to drive a first pixel P1 to emit light by using a first set of test signals according to the control of a first switch signal and a second switch signal. For example, if the first circuit 1 is in a conductive state under the control of the first switch signal and the second switch signal, the first circuit 1 drives the first pixel P1 to emit light by using the first set of test signals. The second circuit 2 is electrically connected with the first switching signal line SW1, the second switching signal line SW2 and the first set of test signal lines G-ETD1 and configured to drive a second pixel P2 to emit light by using a first set of test signals according to the control of the first switch signal and the second switch signal. For example, if the second circuit 2 is in a conductive state under the control of the first switch signal and the second switch signal, the second circuit 2 drives the first pixel P2 to emit light by using the first set of test signals.

The third circuit 3 is electrically connected with the first switching signal line SW1 and the second set of test signal lines G-ETD2 and configured to drive a third pixel P3 to emit light by using the second set of test signals according to the control of the first switch signal. For example, if the third circuit 3 is in a conductive state under the control of the first switch signal, the third circuit 3 drives the third pixel P3 to emit light by using the second set of test signals.

It should be noted that the first pixel P1, the second pixel P2, and the third pixel P3 are mutually different. In some embodiments, the first pixel P1 is blue pixel, the second pixel is red pixel, and the third pixel is green pixel. Of course, the first pixel P1, the second pixel P2, and the third pixel P3 may also be set to different primary colors in the chromaticity space, respectively, according to the chromaticity space used.

In the test device provided in the above embodiment of the present disclosure, the first switching signal line and the second switching signal line are shared, thus the number of switching signal lines is effectively reduced, and the space occupied by the test circuit is effectively reduced, which is helpful for designing a narrow frame product.

Figure 2:
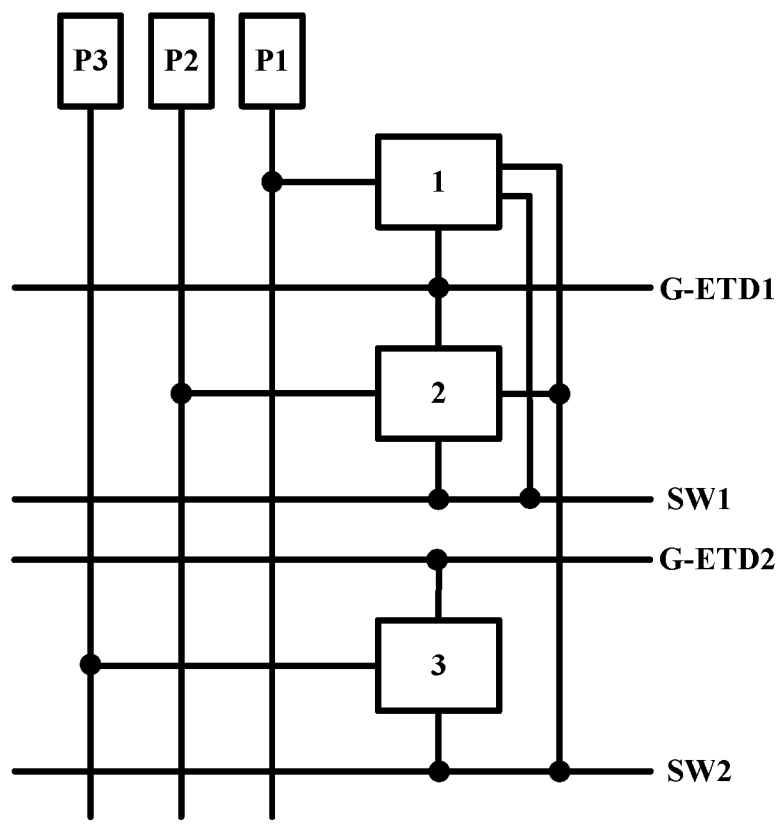
FIG. 2 is a structural diagram of a test device according to another embodiment of the present disclosure.

FIG. 2 is a structural diagram of a test device according to another embodiment of the present disclosure. The difference between FIG. 2 and FIG. 1 is that, in the embodiment shown in FIG. 1, the third circuit 3 is electrically connected with the first switching signal line SW1, while in the embodiment shown in FIG. 2, the third circuit 3 is electrically connected with the second switching signal line SW2.

As shown in FIG. 2, the third circuit 3 is electrically connected with the second switching signal line SW2 and the second set of test signal lines G-ETD2. Thereby, the third circuit 3 drives the third pixel P3 to emit light by using the second set of test signals according to the control of the second switching signal.

Figure 3:
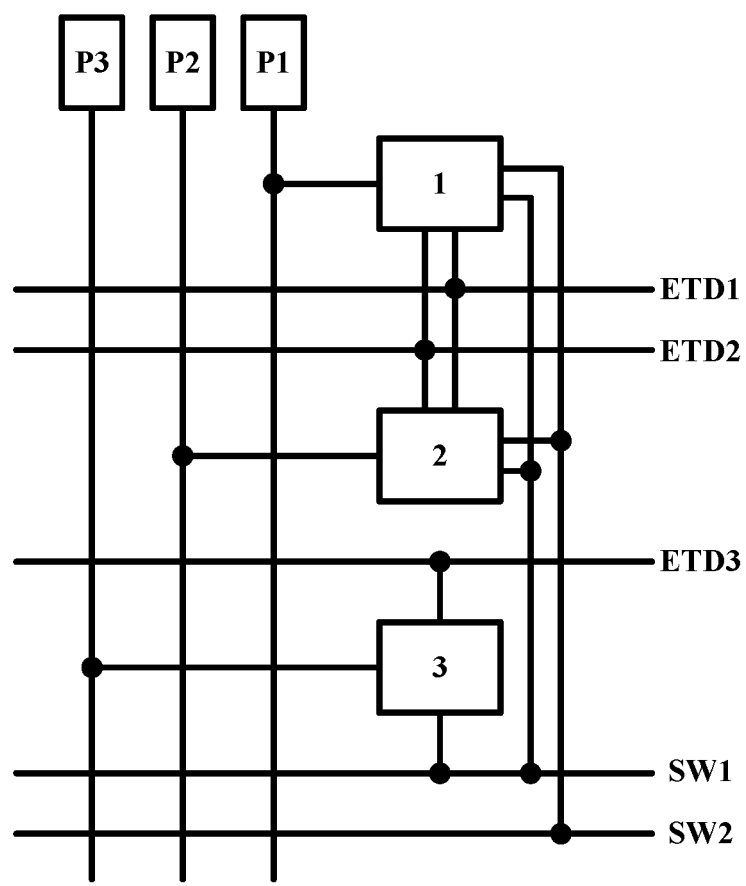
FIG. 3 is a structural diagram of a test device according to still another embodiment of the present disclosure.

FIG. 3 is a structural diagram of a test device according to still another embodiment of the present disclosure. The difference between FIG. 3 and FIG. 1 is that, in the embodiment shown in FIG. 3, the first set of test signal lines G-ETD1 includes a first test signal line ETD1 and a second test signal line ETD2. The second set of test signal lines G-ETD2 includes a third test signal line ETD3. The first test signal line ETD1 and the second test signal line ETD2 are electrically connected with the first circuit 1 and the second circuit 2, and the third test signal line ETD3 is electrically connected with the third circuit 3.

As shown in FIG. 3, the first circuit 1 and the second circuit 2 are electrically connected with the first switching signal line SW1, the second switching signal line SW2, the first test signal line ETD1 and the second set test signal line ETD2. Therefore, the first circuit 1 and the second circuit 2 are respectively controlled by using combinations of different states of the first switching signal line SW1, different states of the second switching signal line SW2, different states of the first test signal line ETD1 and different states of the second test signal line ETD2, thereby further controlling whether the first pixel P1 and the second pixel P2 emit light, respectively. The third circuit 3 is electrically connected with the first switching signal line SW1 and the third test signal line ETD3. Therefore, the third circuit 3 is controlled according to combinations of different states of the first switching signal line SW1 and different states of the third test signal line ETD3, thereby controlling whether the third pixel P3 emit light.

Figure 4:
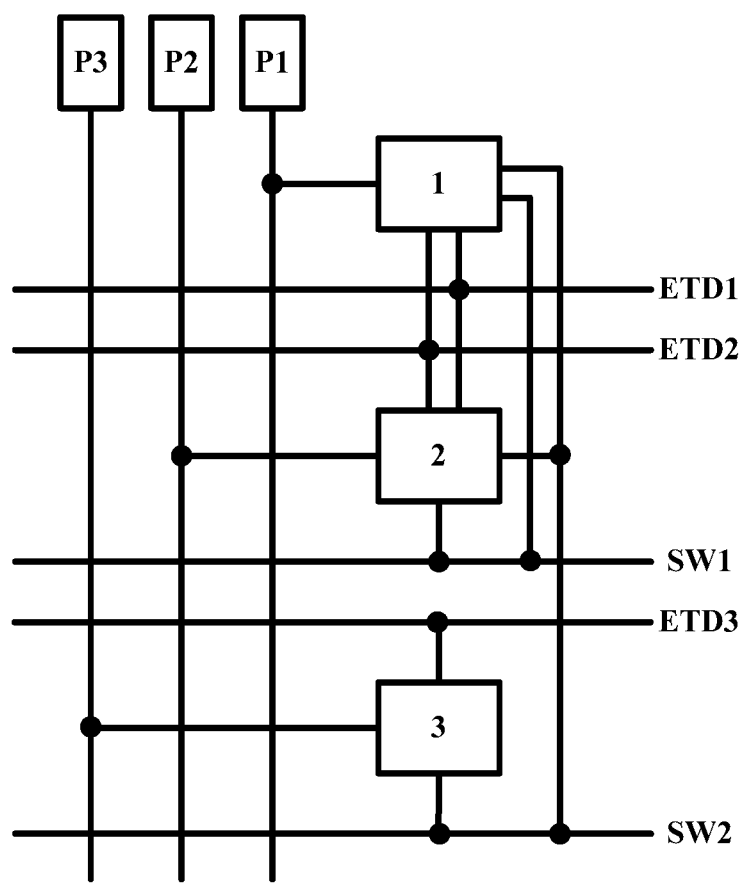
FIG. 4 is a structural diagram of a test device according to still another embodiment of the present disclosure.

FIG. 4 is a structural diagram of a test device according to still another embodiment of the present disclosure. The difference between FIG. 4 and FIG. 3 is that, in the embodiment shown in FIG. 3, the third circuit 3 is electrically connected with the first switching signal line SW1, while in the embodiment shown in FIG. 4, the third circuit 3 is electrically connected with the second switching signal line SW2.

As shown in FIG. 4, the third circuit 3 is electrically connected with the second switching signal line SW2 and the third test signal line ETD3. Therefore, the third circuit 3 is controlled according to combinations of different states of the second switching signal line SW2 and different states of the third test signal line ETD3, thereby controlling whether the third pixel P3 emit light.

Figure 5:
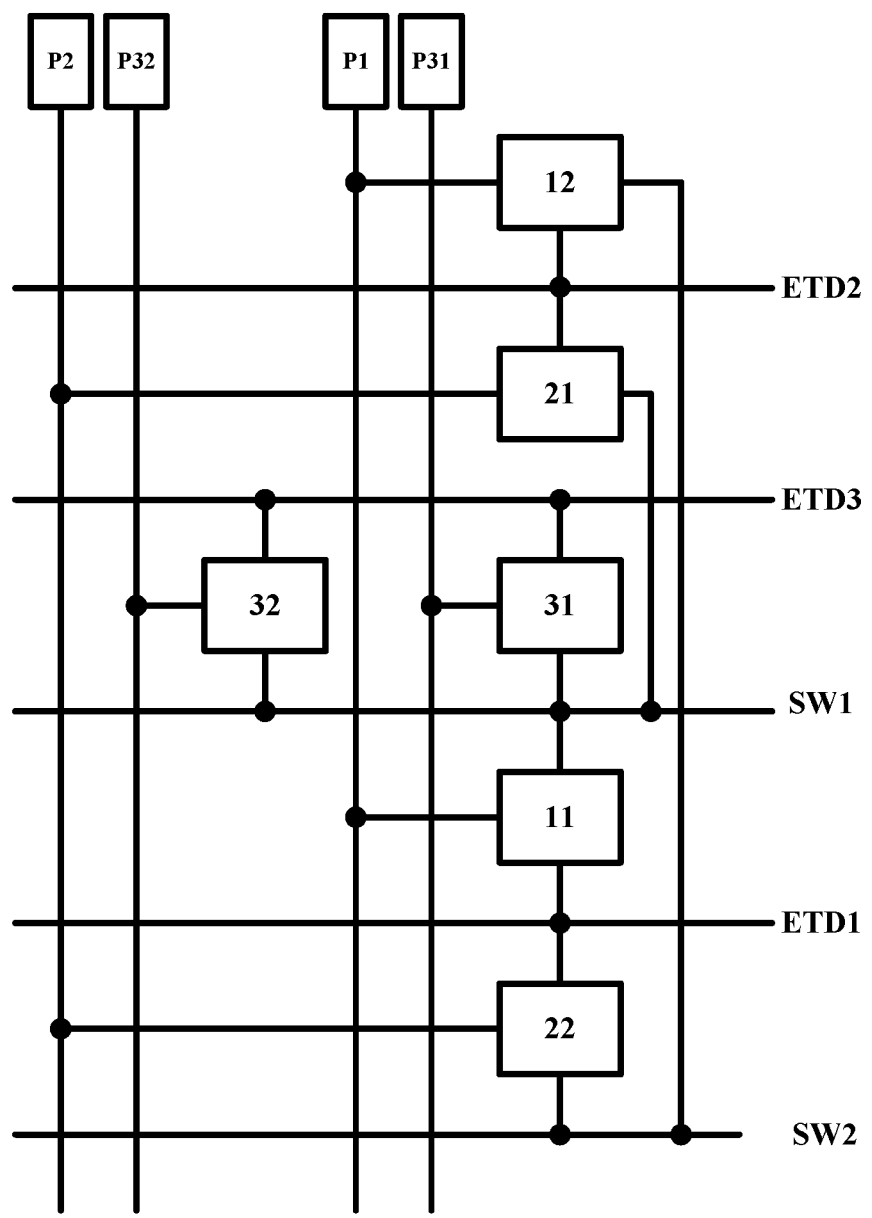
FIG. 5 is a structural diagram of a test device according to still another embodiment of the present disclosure.

FIG. 5 is a structural diagram of a test device according to still another embodiment of the present disclosure.

As shown in FIG. 5, the third pixel P3 include a first sub-pixel P31 and a second sub-pixel P32. The first sub-pixel P31 and the second sub-pixel P32 have the same color.

Moreover, in the embodiment shown in FIG. 5, the third circuit 1 includes a first switch 11 and a second switch 12.

The first switch 11 is electrically connected with the first switching signal line SW1 and the first test signal line ETD1, and is configured to drive the first pixel P1 to emit light by using the first test signal under the control of the first switch signal.

The second switch 12 is electrically connected with the second switching signal line SW2 and the second test signal line ETD2, and is configured to drive the first pixel P1 to emit light by using the second test signal under the control of the second switch signal.

In some embodiments, as shown in FIG. 5, the second circuit 2 includes a third switch 21 and a fourth switch 22.

The third switch 21 is electrically connected with the first switching signal line SW1 and the second test signal line ETD2, and is configured to drive the second pixel P2 to emit light by using the second test signal under the control of the first switch signal.

The fourth switch 22 is electrically connected with the second switching signal line SW2 and the first test signal line ETD1, and is configured to drive the second pixel P2 to emit light by using the first test signal under the control of the second switch signal.

In some embodiments, as shown in FIG. 5, the third circuit 3 includes a fifth switch 31 and a sixth switch 32.

The fifth switch 31 is electrically connected with a first switching signal line SW1 and a third test signal line ETD3, and is configured to drive the first sub-pixel P31 to emit light by using the third test signal under the control of the first switch signal.

The sixth switch 32 is electrically connected with a first switching signal line SW1 and a third test signal line ETD3, and is configured to drive the second sub-pixel P32 to emit light by using the third test signal under the control of the first switch signal.

In some embodiments, the first switch 11, the second switch 12, the third switch 21, the fourth switch 22, the fifth switch 31 and the sixth switch 32 are switching transistors, or other circuits or devices capable of performing switching operations according to switch signals.

Figure 6:
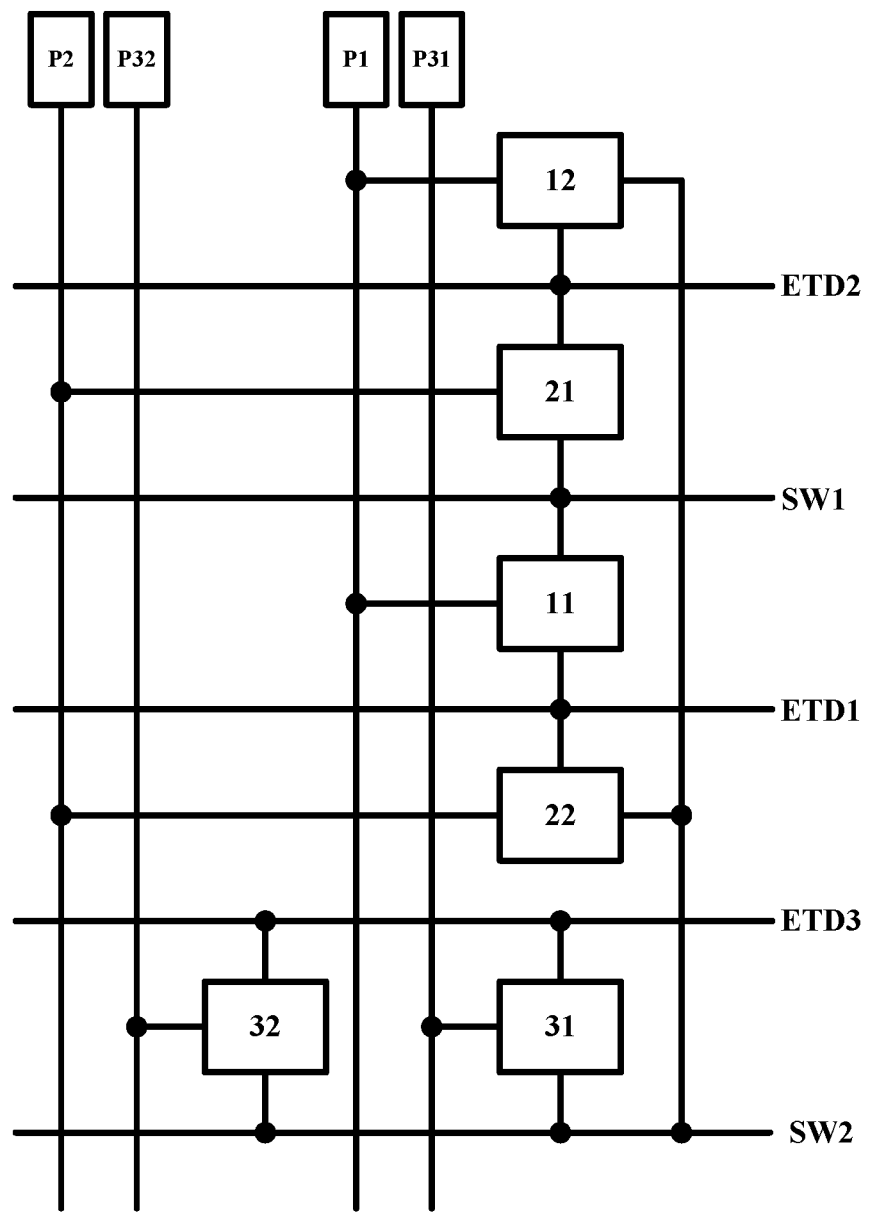
FIG. 6 is a structural diagram of a test device according to still another embodiment of the present disclosure.

FIG. 6 is a structural diagram of a test device according to still another embodiment of the present disclosure. The difference between FIG. 6 and FIG. 5 is that, in FIG. 5, the fifth switch 31 and the sixth switch 32 are electrically connected with the first switching signal line SW1, while in FIG. 6, the fifth switch 31 and the sixth switch 32 are electrically connected with the second switching signal line SW2.

As shown in FIG. 6, the fifth switch 31 is electrically connected with a second switching signal line SW2 and a third test signal line ETD3, and is configured to drive the first sub-pixel P31 to emit light by using the third test signal under the control of the second switch signal. The sixth switch 32 is electrically connected with a second switching signal line SW2 and a third test signal line ETD3, and is configured to drive the second sub-pixel P32 to emit light by using the third test signal under the control of the second switch signal.

Figure 7:
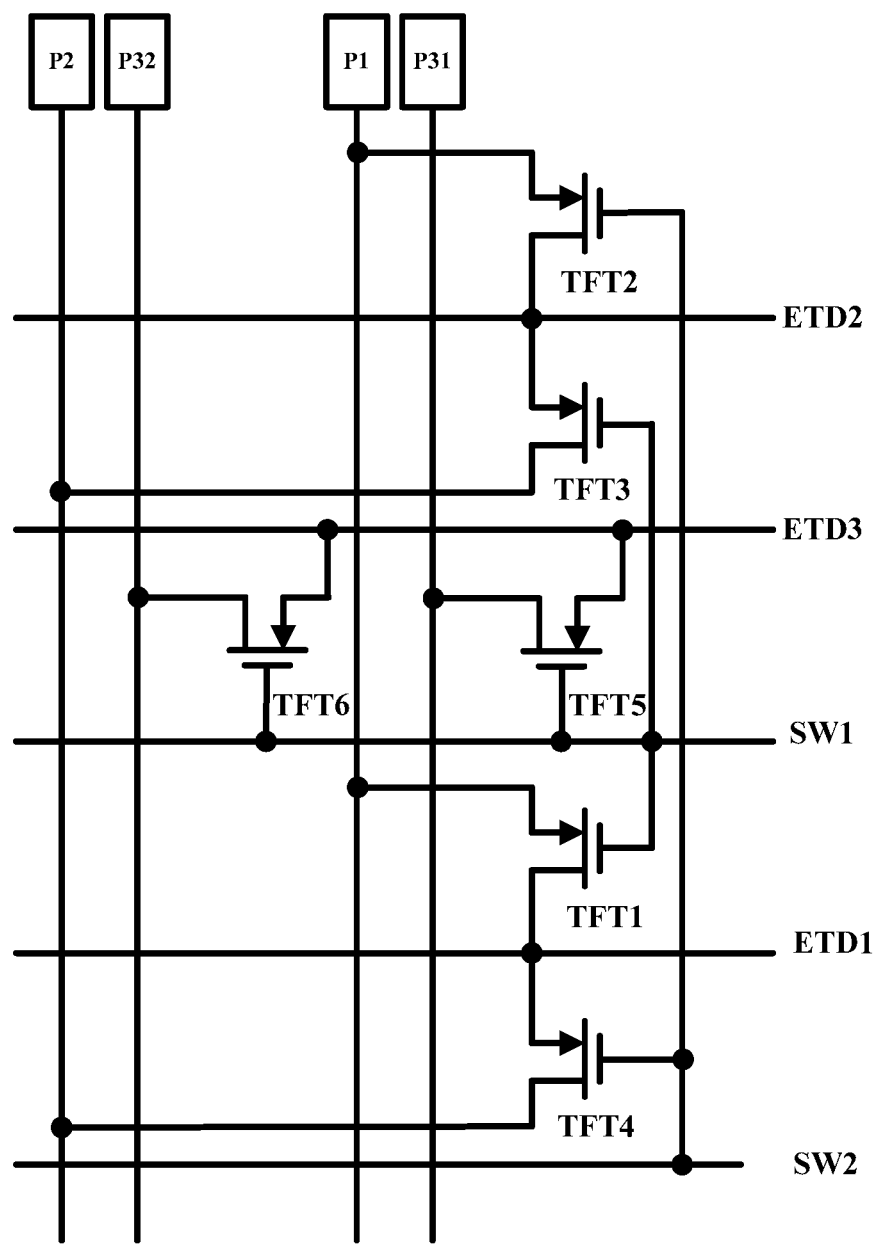
FIG. 7 is a structural diagram of a test device according to still further embodiments of the present disclosure.

FIG. 7 is a structural diagram of a test device according to still another embodiment of the present disclosure. The difference between FIG. 7 and FIG. 5 is that, in the embodiment shown in FIG. 7, the first switch 11 is a PMOS transistor TFT1, the second switch 12 is a PMOS transistor TFT2, the third switch 21 is a PMOS transistor TFT3, the fourth switch 22 is a PMOS transistor TFT4, the fifth switch 31 is a PMOS transistor TFT5, and the sixth switch 32 is a PMOS transistor TFT6.

As shown in FIG. 7, a gate of the transistor TFT1 is electrically connected with the first switching signal line SW1, a drain of the transistor TFT1 is electrically connected with the first test signal line ETD1, and a source of the transistor TFT1 is electrically connected with the first pixel P1. A gate of the transistor TFT2 is electrically connected with the second switching signal line SW2, a drain of the transistor TFT2 is electrically connected with the second test signal line ETD2, and a source of the transistor TFT2 is electrically connected with the first pixel P1.

A gate of the transistor TFT3 is electrically connected with the first switching signal line SW1, a source of the transistor TFT3 is electrically connected with the second test signal line ETD2, and a drain of the transistor TFT3 is electrically connected with the second pixel P2. A gate of the transistor TFT4 is electrically connected with the second switching signal line SW2, a source of the transistor TFT4 is electrically connected with the first test signal line ETD1, and a drain of the transistor TFT4 is electrically connected with the second pixel P2.

A gate of the transistor TFT5 is electrically connected with the first switching signal line SW1, a source of the transistor TFT5 is electrically connected with the third test signal line ETD3, and a drain of the transistor TFT5 is electrically connected with the first sub-pixel P31.

A gate of the transistor TFT6 is electrically connected with the first switching signal line SW1, that is, electrically connected with the gate of the transistor TFT5, and a source of the transistor TFT6 is electrically connected with the third test signal line ETD3, and a drain of the transistor TFT6 is electrically connected with the second sub-pixel P32.

In some embodiments, the first pixel P1 is blue, the second pixel P2 is red, and the first sub-pixel P31 and the second sub-pixel P32 included in the third pixel P3 are both green.

It should be noted that the first pixel P1 represent blue pixels on the whole display panel, the second pixel P2 represent red pixels on the whole display panel, and the third pixel P3 represent green pixels on the whole display panel.

As shown in FIG. 7, in the case where the first switching signal provided by the first switch signal line SW1 is at a low level and the second switch signal provided by the second switching signal line SW2 is at a high level, the transistors TFT1, TFT3, TFT5 and TFT6 are turned on, and the transistors TFT2 and TFT4 are turned off. At this time, the transistor TFT1 drives the first pixel P1 according to the first test signal provided by the first test signal line ETD1. The transistor TFT3 drives the second pixel P2 according to the second test signal provided by the second test signal line ETD2. The transistor TFT5 drives the first sub-pixel P31 according to the third test signal provided by the third test signal line ETD3. The transistor TFT6 drives the second sub-pixel P32 according to the third test signal.

In the case where the first switch signal is at a high level and the second switch signal is at a low level, the transistors TFT1, TFT3, TFT5 and TFT6 are turned off, and the transistors TFT2 and TFT4 are turned on. At this time, the transistor TFT2 drives the first pixel P1 according to the second test signal provided by the second test signal line ETD2, and the transistor TFT4 drives the second pixel P2 according to the first test signal provided by the first test signal line ETD1.

Figure 8:
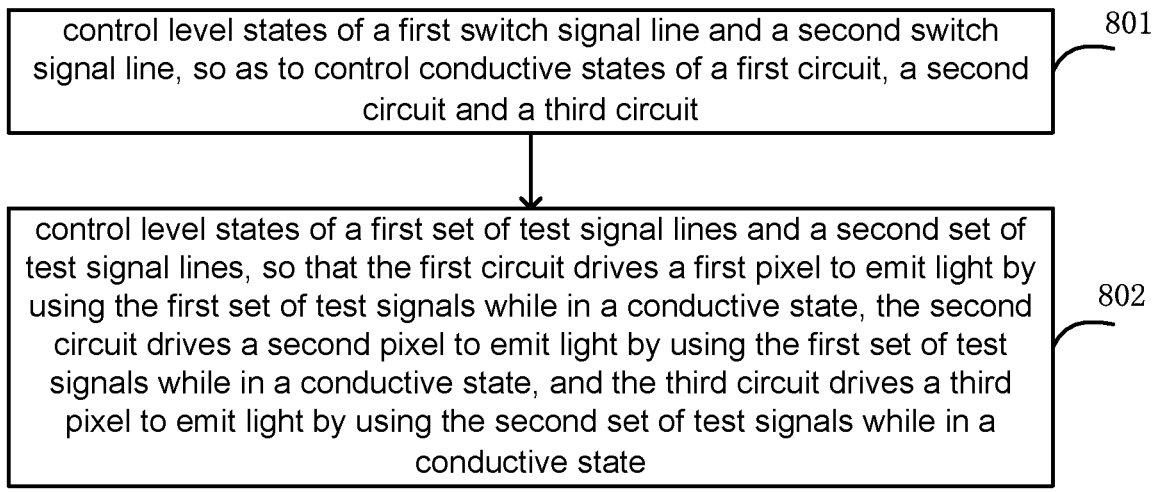
FIG. 8 is a flow chart of a test method according to one embodiment of the present disclosure.

FIG. 8 is a flow chart of a test method according to one embodiment of the present disclosure.

In step 801, level states of the first switching signal line and the second switching signal line are controlled so as to control the conductive states of the first circuit, the second circuit, and the third circuit.

At step 802, level states of the first set of test signal lines and the second set of test signal lines are controlled, so that the first circuit drives the first pixel to emit light by using the first set of test signals while in a conductive state, the second circuit drives the second pixel to emit light by using the first set of test signals while in a conductive state, and the third circuit drives the third pixel to emit light by using the second set of test signals while in a conductive state.

Figure 9:
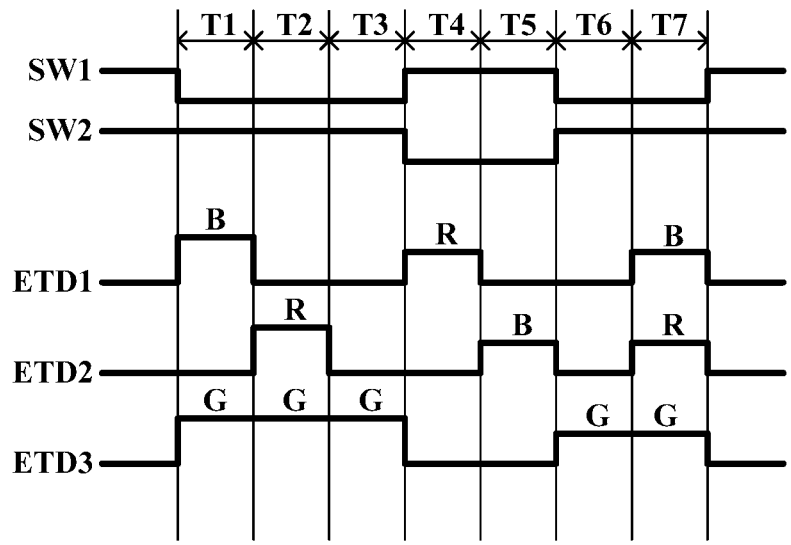
FIG. 9 is a signal timing chart of a test device according to one embodiment of the present disclosure.

FIG. 9 is a signal timing chart of a test device according to one embodiment of the present disclosure. Here, let the first pixel P1 be blue (B) pixel, the second pixel P2 be red (R) pixel, and the first sub-pixel P31 and the second sub-pixel P32 be green (G) pixels.

As shown in FIG. 9, in a first time period T1, the first switch signal is at a low level, and the second switch signal is at a high level. At this time, according to the test device shown in FIG. 7, the transistors TFT1, TFT3, TFT5 and TFT6 are turned on, and the transistors TFT2 and TFT4 are turned off. In the first time period T1, the first test signal and the third test signal are both at a first high level, and the second test signal is at a low level. Since the first test signal is at the first high level, the transistor TFT1 drives the first pixel P1 with a first high level, such that the blue pixel is lighted up. Since the third test signal is also at the first high level, the transistor TFT5 drives the first sub-pixel P31 with the first high level, and the transistor TFT6 drives the second sub-pixel P32 with the first high level, so that the green pixels are also lighted up. At this time, the test screen displays a cyan color.

In the second time period T2, the first switch signal is still at a low level, and the second switch signal is still at a high level, so the transistors TFT1, TFT3, TFT5 and TFT6 are still in a conductive state. In the second time period T2, the first test signal is at a low level, and the second test signal and the third test signal are both at a first high level. Since the second test signal is at the first high level, the transistor TFT3 drives the second pixel P2 with the first high level, such that the red pixel is lighted up. Since the third test signal is also at the first high level, the transistor TFT5 drives the first sub-pixel P31 with the first high level, and the transistor TFT6 drives the second sub-pixel P32 with the first high level, so that the green pixels are also lighted up. At this time, the test screen displays a yellow color.

In the third time period T3, the first switch signal is still at a low level, and the second switch signal is still at a high level, so the transistors TFT1, TFT3, TFT5 and TFT6 are still in a conductive state. In the third time period T3, the first test signal and the second test signal are at low levels, and the third test signal is at a first high level. Since the third test signal is at the first high level, the transistor TFT5 drives the first sub-pixel P31 with the first high level, and the transistor TFT6 drives the second sub-pixel P32 with the first high level, so that the green pixels are also lighted up. At this time, the test screen displays a green color.

In a fourth time period T4, the first switch signal becomes a high level, and the second switch signal becomes a low level. At this time, according to the test device shown in FIG. 7, the transistors TFT1, TFT3, TFT5 and TFT6 are turned off, and the transistors TFT2 and TFT4 are turned on. In the fourth time period T4, the first test signal is at a second high level, and the second test signal and the third test signal are at a low level. Since the first test signal is at the second high level, the transistor TFT4 drives the second pixel P2 with the second high level, such that the red pixel are lighted up. At this time, the test screen displays a red color.

It should be noted that since the level values of the first high level and the second high level are different, the brightness of the pixel when it is lighted up may be different.

In the fifth time period T5, the first switch signal is still at a high level, and the second switch signal is still at a low level, so the transistors TFT2 and TFT4 are still in a conductive state. In the fifth time period T5, the first test signal and the third test signal are at a low level, and the second test signal is at a second high level. Since the second test signal is at the second high level, the transistor TFT2 drives the first pixel P1 with the second high level, such that the blue pixel is lighted up. At this time, the test screen displays a blue color.

In a sixth time period T6, the first switch signal becomes a low level, and the second switch signal becomes a high level. At this time, according to the test device shown in FIG. 7, the transistors TFT1, TFT3, TFT5 and TFT6 are turned on, and the transistors TFT2 and TFT4 are turned off. In the sixth time period T6, the first test signal and the second test signal are at a low level, and the third test signal is at a second high level. Since the third test signal is at the second high level, the transistor TFT5 drives the first sub-pixel P31 with the second high level, and the transistor TFT6 drives the second sub-pixel P32 with the second high level, so that the green pixels are lighted up. At this time, the test screen displays a green color.

In a seventh time period T7, the first switch signal remains at a low level, and the second switch signal remains at a high level, so the transistors TFT1, TFT3, TFT5 and TFT6 are still in a conductive state. In the seventh time period T7, the first test signal, the second test signal and the third test signal are all at a second high level. Since the first test signal is at the second high level, the transistor TFT1 drives the first pixel P1 with the second high level, such that the blue pixel is lighted up. Since the second test signal is at the second high level, the transistor TFT3 drives the second pixel P2 with the second high level, such that the red pixel is lighted up. Since the third test signal is at a second high level, the transistor TFT5 drives the first sub-pixel P31 with the second high level, and the transistor TFT6 drives the second sub-pixel P32 with the second high level, so that the green pixels are also lighted up. At this time, the test screen displays a white color.

Thus, the level values of the first switch signal, the second switch signal, the first test signal, the second test signal and the third test signal are controlled, so that the test screen can be displayed in different colors.

It should be noted that there is no order for the time periods in the embodiment shown in FIG. 9. Corresponding level values can be set for the first switch signal, the second switch signal, the first test signal, the second test signal and the third test signal as needed.

Figure 10:
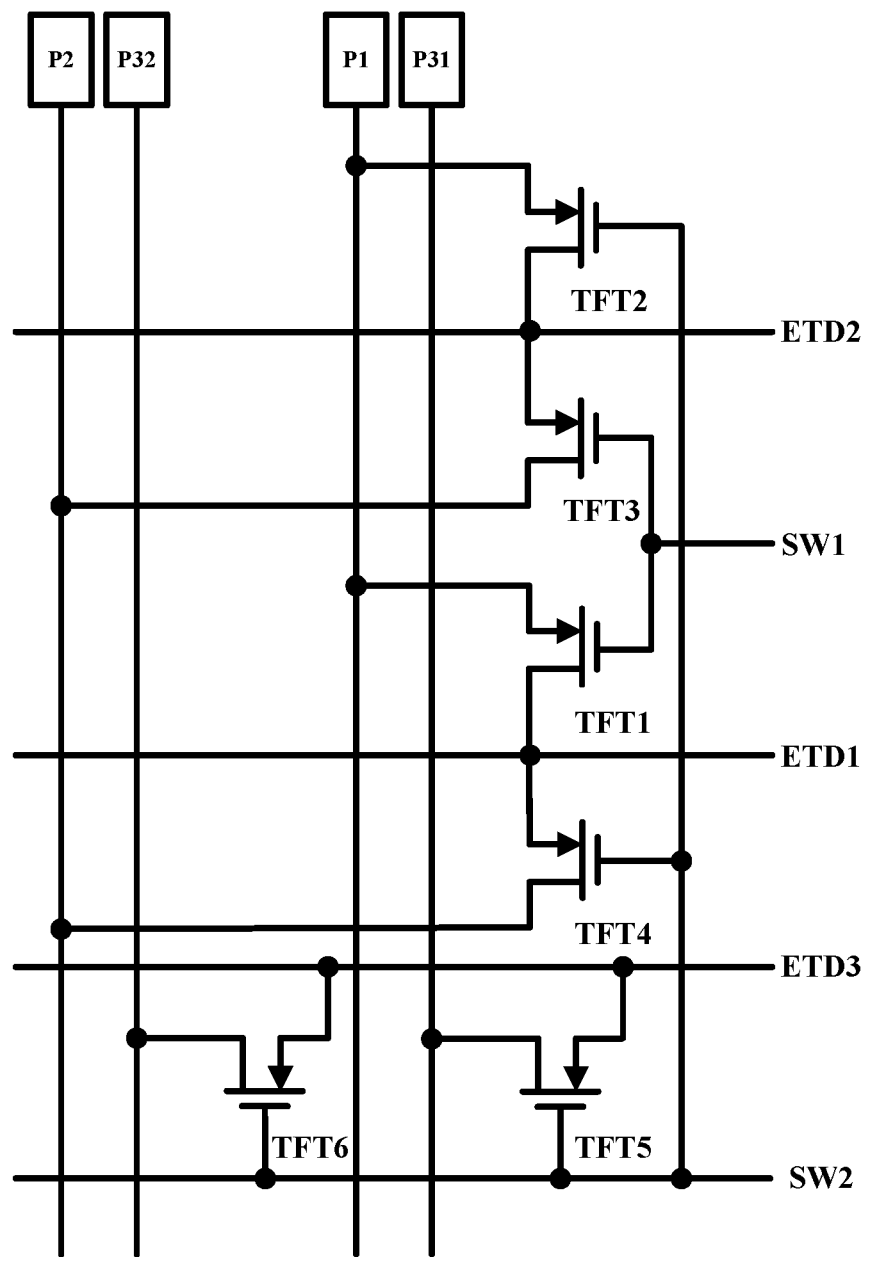
FIG. 10 is a structural diagram of a test device according to still another embodiment of the present disclosure.

FIG. 10 is a structural diagram of a test device according to still another embodiment of the present disclosure. The difference between FIG. 10 and FIG. 6 is that, in the embodiment shown in FIG. 10, the first switch 11 is a PMOS transistor TFT1, the second switch 12 is a PMOS transistor TFT2, the third switch 21 is a PMOS transistor TFT3, the fourth switch 22 is a PMOS transistor TFT4, the fifth switch 31 is a PMOS transistor TFT5, and the sixth switch 32 is a PMOS transistor TFT6. In some embodiments, the first pixel P1 is blue, the second pixel P2 is red, and the first sub-pixel P31 and the second sub-pixel P32 included in the third pixel P3 are both green.

As shown in FIG. 10, a gate of the transistor TFT1 is electrically connected with the first switching signal line SW1, a drain of the transistor TFT1 is electrically connected with the first test signal ETD1, and a source of the transistor TFT1 is electrically connected with the first pixel P1. A gate of the transistor TFT2 is electrically connected with the second switching signal line SW2, a drain of the transistor TFT2 is electrically connected with the second test signal line ETD2, and a source of the transistor TFT2 is electrically connected with the first pixel P1.

A gate of the transistor TFT3 is electrically connected with the first switching signal line SW1, a source of the transistor TFT3 is electrically connected with the second test signal line ETD2, and a drain of the transistor TFT3 is electrically connected with the second pixel P2. A gate of the transistor TFT4 is electrically connected with the second switching signal line SW2, a source of the transistor TFT4 is electrically connected with the first test signal line ETD1, and a drain of the transistor TFT4 is electrically connected with the second pixel P2.

A gate of the transistor TFT5 is electrically connected with the second switching signal line SW2, a source of the transistor TFT5 is electrically connected with the third test signal line ETD3, and a drain of the transistor TFT5 is electrically connected with the first sub-pixel P31.

A gate of the transistor TFT6 is electrically connected with the second switching signal line SW2, that is, electrically connected with the gate of the transistor TFT5, a source of the transistor TFT6 is electrically connected with the third test signal line ETD3, and a drain of the transistor TFT6 is electrically connected with the second sub-pixel P32.

Figure 11:
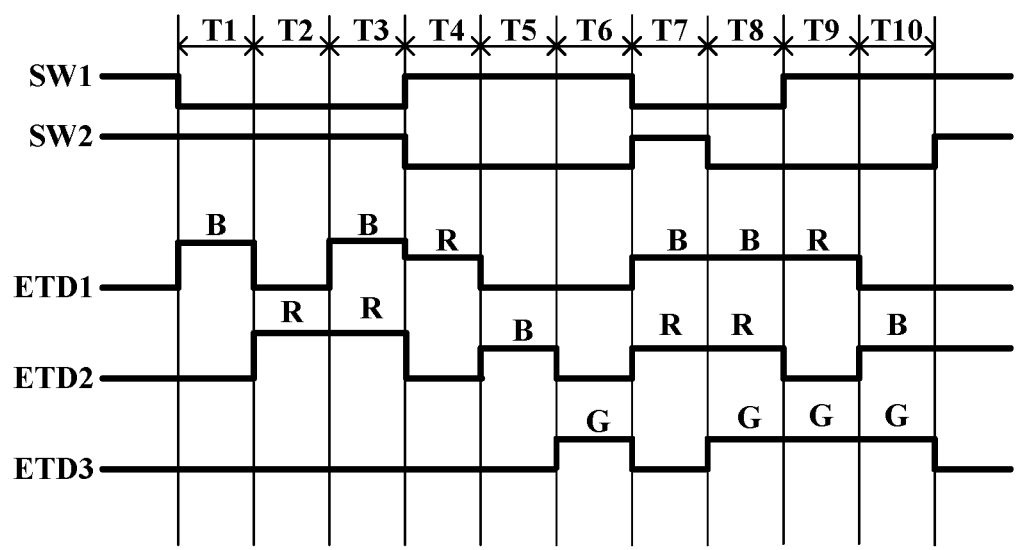
FIG. 11 is a signal timing chart of a test device according to further embodiments of the present disclosure.

FIG. 11 is a signal timing chart of a test device according to another embodiment of the present disclosure. Here, let the first pixel P1 be blue (B) pixel, the second pixel P2 be red (R) pixel, and the first sub-pixel P31 and the second sub-pixel P32 be green (G) pixels.

As shown in FIG. 11, in a first time period T1, the first switch signal is at a low level, and the second switch signal is at a high level. At this time, according to the test device shown in FIG. 10, the transistor TFT1 and the transistor TFT3 are turned on, and the transistor TFT2, the transistor TFT4, the transistor TFT5 and the transistor TFT6 are turned off. In the first time period T1, the first test signal is at a first high level, and the second test signal and the third test signal are at a low level. Since the first test signal is at the first high level, the transistor TFT1 drives the first pixel P1 with the first high level, such that the blue pixel is lighted up. At this time, the test screen displays a blue color.

In a second time period T2, the first switch signal is still at a low level, and the second switch signal is still at a high level, so that the transistors TFT1 and TFT3 are still in a conductive state. In the second time period T2, the first test signal and the third test signal are both at a low level, and the second test signal is at a first high level. Since the second test signal is at the first high level, the transistor TFT3 drives the second pixel P2 with the first high level, such that the red pixel is lighted up. At this time, the test screen displays a red color.

In the third time period T3, the first switch signal is still at a low level, and the second switch signal is still at a high level, so the transistors TFT1 and TFT3 are still in a conductive state. In the third time period T3, the first test signal and the second test signal are both at a first high level, and the third test signal is at a low level. Since the first test signal is at the first high level, the transistor TFT1 drives the first pixel P1 with the first high level, such that the blue pixel is lighted up. Since the second test signal is at the first high level, the transistor TFT3 drives the second pixel P2 with the first high level, such that the red pixel is lighted up. At this time, the test screen displays a purple color.

In a fourth time period T4, the first switch signal becomes a high level, and the second switch signal becomes a low level. At this time, according to the test device shown in FIG. 7, the transistors TFT1 and TFT3 are turned off, and the transistors TFT2, TFT4, TFT5 and TFT6 are turned on. In the fourth time period T4, the first test signal is at a second high level, and the second test signal and the third test signal are at a low level. Since the first test signal is at the second high level, the transistor TFT4 drives the second pixel P2 with the second high level, such that the red pixel are lighted up. At this time, the test screen displays a red color.

In a fifth time period T5, the first switch signal is still at a high level, and the second switch signal is still at a low level, so the transistors TFT2, TFT4, TFT5 and TFT6 are still in a conductive state. In the fifth time period T5, the first and third test signals are at low levels, and the second test signal is at a second high level. Since the second test signal is at the second high level, the transistor TFT2 drives the first pixel P1 with the second high level, such that the blue pixel is lighted up. At this time, the test screen displays a blue color.

In a sixth time period T6, the first switch signal is still at a high level, and the second switch signal is still at a low level, so the transistors TFT2, TFT4, TFT5 and TFT6 are still in a conductive state. In the sixth time period T6, the first test signal and the second test signal are at a low level, and the third test signal is at a second high level. Since the third test signal is at the second high level, the transistor TFT5 drives the first sub-pixel P31 with the second high level, and the transistor TFT6 drives the second sub-pixel P32 with the second high level, so that the green pixels are lighted up. At this time, the test screen displays a green color.

In a seventh time period T7, the first switch signal becomes at a low level, and the second switch signal becomes a high level. At this time, according to the test device shown in FIG. 7, the transistors TFT1 and TFT3 are turned on, and the transistors TFT2, TFT4, TFT5 and TFT6 are turned off. In the seventh time period T7, the first test signal and the second test signal are both at a second high level, and the third test signal is at a low level. Since the first test signal is at the second high level, the transistor TFT1 drives the first pixel P1 with the second high level, such that the blue pixel is lighted up. Since the second test signal is at the second high level, the transistor TFT3 drives the second pixel P2 with the second high level, such that the red pixel is lighted up. At this time, the test screen displays a purple color.

In an eighth time period T8, the first switch signal is still at a low level, and the second switch signal becomes a low level. At this time, according to the test device shown in FIG. 7, the transistors TFT1, TFT2, TFT3, TFT4, TFT5 and TFT6 are turned on. In the eighth time period T8, the first test signal, the second test signal and the third test signal are all at a second high level. Since the first test signal is at the second high level, the transistor TFT1 drives the first pixel P1 with the second high level, so that the blue pixel is lighted up, and the transistor TFT4 drives the second pixel P2 with the second high level, so that the red pixel is lighted up. Since the second test signal is at the second high level, the transistor TFT2 also drives the first pixel P1 with the second high level, and the transistor TFT3 also drives the second pixel P2 with the second high level. Since the third test signal is at the second high level, the transistor TFT5 drives the first sub-pixel P31 with the second high level, and the transistor TFT6 drives the second sub-pixel P32 with the second high level, so that the green pixels are also lighted up. At this time, the test screen displays a white color.

In a ninth time period T9, the first switch signal becomes a high level, and the second switch signal is still at a low level. At this time, according to the test device shown in FIG. 7, the transistors TFT1 and TFT3 are turned off, and the transistors TFT2, TFT4, TFT5 and TFT6 are turned on. In the ninth time period T9, the first test signal and the third test signal are both at a second high level, and the second test signal is at a low level. Since the first test signal is at the second high level, the transistor TFT4 drives the second pixel P2 with the second high level, such that the red pixel is lighted up. Since the third test signal is at the second high level, the transistor TFT5 drives the first sub-pixel P31 with the second high level, and the transistor TFT6 drives the second sub-pixel P32 with the second high level, so that the green pixels are also lighted up. At this time, the test screen displays a yellow color.

In a tenth time period T10, the first switch signal is still at a high level, and the second switch signal is still at a low level, so the transistors TFT2, TFT4, TFT5 and TFT6 are still in a conductive state. In the tenth time period T10, the first test signal is at a low level, and the second test signal and the third test signal are both at a second high level. Since the second test signal is at the second high level, the transistor TFT2 drives the first pixel P1 with the second high level, such that the blue pixel is lighted up. Since the third test signal is at the second high level, the transistor TFT5 drives the first sub-pixel P31 with the second high level, and the transistor TFT6 drives the second sub-pixel P32 with the second high level, so that the green pixels are also lighted up. At this time, the test screen displays a cyan color.

Thus, the level values of the first switch signal, the second switch signal, the first test signal, the second test signal, and the third test signal are controlled, thus the test screen can be displayed in different colors.

It should be noted that there is no order for the time periods in the embodiment shown in FIG. 11. Corresponding level values can be set for the first switch signal, the second switch signal, the first test signal, the second test signal and the third test signal as needed.

Up to this point, the embodiments of the present disclosure have been described in detail. In order to avoid obscuring the concepts of the present disclosure, some details known in the art are not described. Those skilled in the art can totally understand how to implement the technical solution disclosed here according to the above description.

Although some specified embodiments of the present disclosure have been explained in detail by the examples, those skilled in the art shall understand that the above examples are only intended for making explanation rather than for limiting the scope of the present disclosure. Those skilled in the art shall understand that the above embodiments can be amended or equivalent substitute of part of the technical features can be performed without deviating from the scope and spirit of the present disclosure. The scope of the present disclosure is defined by the following claims.

What is claimed is:

1. A test device, comprising:
   a first circuit electrically connected with a first switching signal line, a second switching signal line and a first set of test signal lines and configured to drive a first pixel to emit light by using a first set of test signals according to a control of a first switch signal and a second switch signal;
   a second circuit electrically connected with the first switching signal line, the second switching signal line and the first set of test signal lines and configured to drive a second pixel to emit light by using the first set of test signals according to the control of the first switch signal and the second switch signal;
   a third circuit electrically connected with the first switching signal line or the second switching signal line, and electrically connected with a second set of test signal lines, and configured to drive a third pixel to emit light by using a second set of test signals according to the control of the first switch signal or the second switch signal, wherein the first pixel, the second pixel and the third pixel are mutually different.

2. The test device according to claim 1, wherein the first set of test signal lines include a first test signal line and a second test signal line.

3. The test device according to claim 2, wherein the first circuit comprising:
   a first switch electrically connected to the first switching signal line and the first test signal line and configured to drive the first pixel to emit light by using a first test signal under the control of the first switch signal;
   a second switch electrically connected with the second switching signal line and the second test signal line and configured to drive the first pixel to emit light by using a second test signal under the control of the second switch signal.

4. The test device according to claim 3, wherein the first switch and the second switch are switching transistors.

5. The test device according to claim 4, wherein
   a gate of the first switch is electrically connected to the first switching signal line, a drain of the first switch is electrically connected to the first test signal line, and a source of the first switch is electrically connected to the first pixel;
   a gate of the second switch is electrically connected to the second switching signal line, a drain of the second switch is electrically connected to the second test signal line, and a source of the second switch is electrically connected to the first pixel.

6. The test device according to claim 2, wherein the second circuit comprising:
   a third switch electrically connected with the first switching signal line and the second test signal line and configured to drive the second pixel to emit light by using the second test signal under the control of the first switch signal;
   a fourth switch electrically connected with the second switching signal line and the first test signal line and configured to drive the second pixel to emit light by using the first test signal under the control of the second switch signal.

7. The test device according to claim 6, wherein the third switch and the fourth switch are switching transistors.

8. The test device according to claim 7, wherein
   a gate of the third switch is electrically connected to the first switching signal line, a source of the third switch is electrically connected to the second test signal line, and a drain of the third switch is electrically connected to the second pixel;
   a gate of the fourth switch is electrically connected to the second switching signal line, a source of the fourth switch is electrically connected to the first test signal line, and a drain of the fourth switch is electrically connected to the second pixel.

9. The test device according to claim 1, wherein the third pixel include a first sub-pixel and a second sub-pixel.

10. The test device according to claim 9, wherein the third circuit comprising:
    a fifth switch electrically connected with the first switching signal line and the second set of test signal lines and configured to drive the first sub-pixel to emit light by using the second set of test signals under the control of the first switch signal;
    a sixth switch electrically connected with the first switching signal line and the second set of test signal lines and configured to drive the second sub-pixel to emit light by using the second set of test signals under the control of the first switch signal.

11. The test device according to claim 10, wherein the fifth switch and the sixth switch are switching transistors.

12. The test device according to claim 11, wherein
- a gate of the fifth switch is electrically connected to the first switching signal line, a source of the fifth switch is electrically connected to the second set of test signal lines, and a drain of the fifth switch is electrically connected to the first sub-pixel;
- a gate of the sixth switch is electrically connected with the gate of the fifth switch, a source of the sixth switch is electrically connected with the second set of test signal lines, and the drain of the sixth switch is electrically connected with the second sub-pixel.

13. The test device according to claim 9, wherein the third circuit comprising:
- a fifth switch electrically connected with the second switching signal line and the second set of test signal lines and configured to drive the first sub-pixel to emit light by using the second set of test signals under the control of the second switch signal;
- a sixth switch electrically connected with the second switching signal line and the second set of test signal lines and configured to drive the second sub-pixel to emit light by using the second set of test signals under the control of the second switch signal.

14. The test device according to claim 13, wherein the fifth switch and the sixth switch are switching transistors.

15. The test device according to claim 14, wherein
- a gate of the fifth switch is electrically connected to the second switching signal line, a source of the fifth switch is electrically connected to the second set of test signal lines, and a drain of the fifth switch is electrically connected to the first sub-pixel;
- a gate of the sixth switch is electrically connected with the gate of the fifth switch, a source of the sixth switch is electrically connected with the second set of test signal lines, and a drain of the sixth switch is electrically connected with the second sub-pixel.

16. The test device according to claim 1, wherein the second set of test signal lines includes a third test signal line.

17. The test device according to claim 1, wherein
- the first pixel is blue pixel;
- the second pixel is red pixel;
- the third pixel is green pixel.

18. A method of testing pixels comprising:
- controlling level states of a first switching signal line and a second switching signal line so as to control conductive states of a first circuit, a second circuit and a third circuit;
- controlling level states of a first set of test signal lines and a second set of test signal lines, so that the first circuit drives a first pixel to emit light by using the first set of test signals while in a conductive state, the second circuit drives a second pixel to emit light by using the first set of test signals while in the conductive state, and the third circuit drives a third pixel to emit light by using the second set of test signals while in the conductive state;
- wherein, the first circuit is electrically connected with the first switching signal line, the second switching signal line and the first set of test signal lines, and is configured to drive the first pixel to emit light by using the first set of test signals according to the control of a first switch signal and a second switch signal;
- the second circuit is electrically connected with the first switching signal line, the second switching signal line and the first set of test signal lines, and is configured to drive the second pixel to emit light by using the first set of test signals according to the control of the first switch signal and the second switch signal;
- the third circuit is electrically connected with the first switching signal line or the second switching signal line, and is electrically connected with the second set of test signal lines, and is configured to drive the third pixel to emit light by using the second set of test signals according to the control of the first switch signal or the second switch signal, wherein the first pixel, the second pixel and the third pixel are mutually different.

* * * * *